United States Patent
Ohshima et al.

(10) Patent No.: US 7,823,105 B2
(45) Date of Patent: Oct. 26, 2010

(54) LAYOUT DATA GENERATION EQUIPMENT OF SEMICONDUCTOR INTEGRATED CIRCUIT, DATA GENERATION METHOD AND MANUFACTURING METHOD OF SEMICONDUCTOR DEVICE

(75) Inventors: Shigeo Ohshima, Kawasaki (JP);
Kiminobu Suzuki, Yokohama (JP);
Kazuhiro Yamada, Zama (JP);
Takamichi Arizono, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 405 days.

(21) Appl. No.: 11/945,537

(22) Filed: Nov. 27, 2007

(65) Prior Publication Data
US 2008/0141196 A1  Jun. 12, 2008

(30) Foreign Application Priority Data
Nov. 28, 2006  (JP) .............................. 2006-320746

(51) Int. Cl.
*G06F 17/50* (2006.01)
(52) U.S. Cl. ......................................... 716/5
(58) Field of Classification Search .................. 716/4–5
See application file for complete search history.

(56) References Cited

U.S. PATENT DOCUMENTS

| | | | |
|---|---|---|---|
| 5,581,475 A | 12/1996 | Majors | |
| 5,831,867 A * | 11/1998 | Aji et al. | 716/4 |
| 6,349,401 B2 * | 2/2002 | Tamaki | 716/2 |
| 6,857,113 B2 * | 2/2005 | Gentry et al. | 716/5 |
| 7,089,129 B2 | 8/2006 | Habitz | |
| 7,155,686 B2 * | 12/2006 | Hou et al. | 716/2 |
| 7,206,731 B2 * | 4/2007 | Sercu et al. | 703/14 |
| 2006/0026540 A1 | 2/2006 | Bhooshan et al. | |

* cited by examiner

*Primary Examiner*—Jack Chiang
*Assistant Examiner*—Brandon W Bowers
(74) *Attorney, Agent, or Firm*—Oblon, Spivak, McClelland, Maier & Neustadt, L.L.P.

(57) ABSTRACT

A layout-data generation equipment includes a logic circuit designing section which designs a logic circuit based on information of the specifications of a semiconductor integrated circuit, a layout-data generation section which creates layout-data based on the logic circuit, a resistance information extraction section which extracts resistance information of a wire from the layout-data, a circuit simulation execution section which executes a circuit simulation, an identification section of current direction which identifies a direction of a current in the wire based on the resistance information of a wire and an execution result of the circuit simulation, a verification section which verifies whether layout-data of the wire breaks a design rule, the design rule being extracted from the information of the specifications of a semiconductor integrated circuit and the verification section generates this verification result, and a data output section which outputs the layout-data.

20 Claims, 9 Drawing Sheets

LAYOUT DATA GENERATION EQUIPMENT OF SEMICONDUCTOR INTEGRATED CIRCUIT, DATA GENERATION METHOD AND MANUFACTURING METHOD OF SEMICONDUCTOR DEVICE

CROSS REFERENCE TO RELATED APPLICATIONS

This application is based upon and claims the benefit of priority from the prior Japanese Patent Application No. 2006-320746, filed on Nov. 28, 2006; the entire contents of which are incorporated herein by reference.

BACKGROUND OF THE INVENTION

1. Field of the Invention

This invention relates to a layout data generation equipment and layout data generation method which realizes electro-migration in the process of generating layout data of a semiconductor integrated circuit. Further, this invention relates to a manufacturing method of a semiconductor device using this generated layout data.

2. Description of the Related Art

At the time when a large current flows through a metal wire of a semiconductor integrated circuit, a phenomenon called electro-migration, whereby a metal atom shifts, sometimes occurs.

That is, at the time when a current flows through a metal wire of a semiconductor integrated circuit, metal atoms receive a stress by a momentum exchange caused by a collision with flowing electrons and shift in the direction of the flow of the electrons. This phenomenon is known as electro-migration. When electro-migration occurs, the trails of the above stated metal atoms which shift in the direction of the flow of the electrons, become an atom void and these atom voids are accumulated in the upper flow of the electron flow. When a sufficient number of these atom voids have accumulated, the effective cross-section area of the metal wire is reduced and finally, the wire breaks, the electrical conduction of the wire is lost, the resistance of the wire increases and failures in signal transmission may occur.

In addition, the occurrence and progress of this electro-migration is influenced by a current near a unit cross section area (below referred to as current density of wiring) and atmosphere temperature. For example, the lifetime of a wire is assumed to be proportional to the square or the cube of the current density of the wire. Japanese Laid Open Document 1995-153845 is used as a reference.

This electro-migration is becoming one of the main causes of failure in a semiconductor device. Particularly, in the field of semiconductors whose development is progressing rapidly in recent years, the current density of a wire has increased considerably with miniaturization and thinning of the metal wire and the possibility of electro-migration occurring is increasing.

As a result, electro-migration should be prevented and in the design stage of a semiconductor integrated circuit, a realization of electro-migration verification in generated layout data and an improvement in the reliability of a semiconductor integrated circuit is being achieved.

Consequently, this invention aims to realize a reliable, high yield, highly integrated semiconductor integrated circuit by proposing a layout data generation equipment and layout data generation method with an improved accuracy of verification of electro-migration which is realized in the process of generating the layout data of a semiconductor integrated circuit in addition to a manufacturing method of a semiconductor device which uses layout data generated by this layout data generation equipment and generation method.

BRIEF SUMMARY OF THE INVENTION

According to one embodiment of the present invention, a layout data generation equipment for a semiconductor integrated circuit comprises a logic circuit designing section which designs a logic circuit based on information of the specifications of a semiconductor integrated circuit, a layout data generation section which creates layout data based on said logic circuit, a resistance information extraction section which extracts resistance information of a wire from said layout data, a circuit simulation execution section which executes a circuit simulation, an identification section of current direction which identifies a direction of a current in said wire based on said resistance information of a wire and an execution result of said circuit simulation, a verification section which verifies whether layout data of said wire breaks a design rule, said design rule being extracted from said information of the specifications of a semiconductor integrated circuit, based on a current direction of said wire and said verification section generates this verification result, and a data output section which outputs said layout data which is generated by said layout data generation section and said verification section verifies all of said wires do not break said design rule.

According to one embodiment of the present invention, a manufacturing method of layout data of a semiconductor integrated circuit comprises designing a logic circuit based on information of the specifications of a semiconductor integrated circuit, generating layout data based on said logic circuit, extracting resistance information of each wire from said layout data, executing a circuit simulation based on said layout data, identifying a direction of each current which flows in each of said wires based on said resistance information of each of said wires and on an execution result of said circuit simulation, verifying whether said layout data of each of said wires breaks a design rule included in said information of the specifications of said semiconductor integrated circuit based on information of said identified direction of each current which flows in each of said wires and generating a verification result, and outputting said layout data when all of said wires are verified as not breaking said design rule.

According to one embodiment of the present invention, a manufacturing method of a semiconductor device comprises designing a logic circuit based on information of the specifications of a semiconductor integrated circuit, generating layout data based on said logic circuit, extracting resistance information of each wire from said layout data, executing a circuit simulation based on said layout data, identifying a direction of each current which flows in/to each of said wires based on said resistance information of each of said wires and on an execution result of said circuit simulation, verifying whether said layout data of each of said wires breaks a design rule included in said information of the specifications of said semiconductor integrated circuit based on information of said identified direction of each current which flows in each of said wires and generating a verification result, and forming a pattern on a substrate based on said layout data where all of said wires are verified as not breaking said design rule.

DETAILED DESCRIPTION OF THE INVENTION

Embodiment One

[The Circumstances Related to this Invention]

Figure 1:
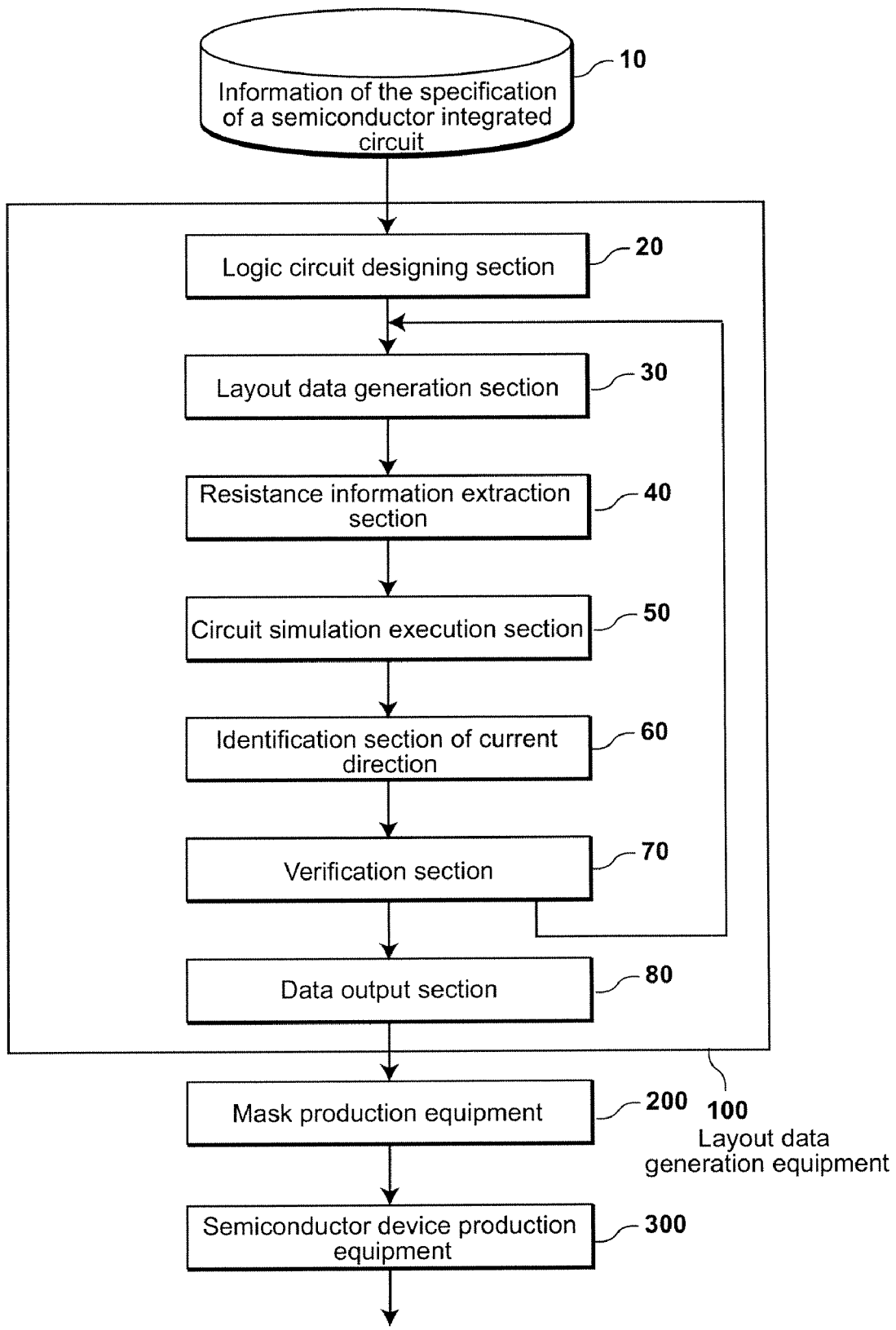
FIG. 1 is a block diagram which shows one example of a layout data generation equipment related to embodiment one of the present invention.

The present embodiment of this invention will be explained in detail below while referring to the drawings. First, the circumstances related to the present invention will be explained below using the drawings.

Figure 8:
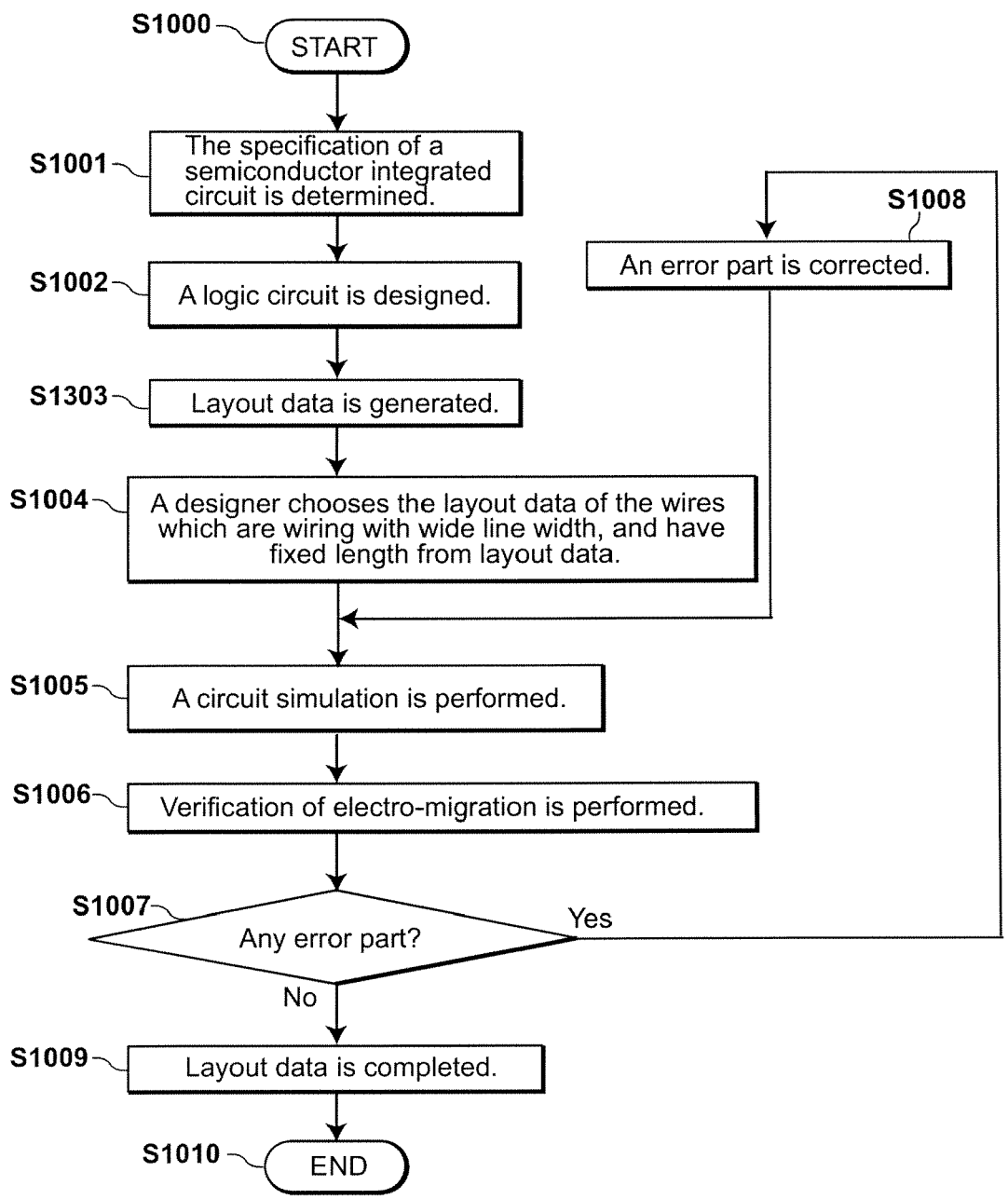
FIG. 8 is a flowchart which shows the general operation of a layout data generation method which executes a verification of electro-migration in the process which creates layout data of a semiconductor integrated circuit.

FIG. 8 is a flowchart which shows the general operation of a layout data generation method which executes a verification of electro-migration in the process which creates layout data of a semiconductor integrated circuit.

As is shown in FIG. 8, first the designer decides the specifications of a semiconductor integrated circuit (step S1001). Next, the designer designs a logic circuit based on information of these specifications (step S1002). Next, the designer creates layout data based on the designed schematic of the logic circuit (step S1003). Next, the designer visually checks the layout data and selects layout data of a wire which has a fixed length and where the line width value is wide, from among the layout data (step S1004).

Next, the designer executes a circuit simulation of this semiconductor integrated circuit (step S1005). Further, the layout data of the selected wire is verified for electro-migration (step S1006).

In the electro-migration verification in step S1006, first the designer calculates the device spec value according to a manual calculation. Next, the designer compares and contrasts this calculated device spec value with the line width value of the layout data of this wire and verifies whether the line width value of the layout data of this wire fulfills the design rule. Here, the device spec value is expressed by the current density of the wire, that is, by I/S (A/m$^2$) which is the current I (A) which flows per unit cross-section area S m$^2$ of the wire. In other words, when a current flows, the size of the burden on the wire is proportional to the size of the device spec value. As a result, there is a need to take a wide line width value of the wire in the layout data in order to prevent the occurrence of electro-migration in a wire with a high device spec value. The information of the line width value of a wire which corresponds to this type of device spec value is included in the information of the specification of the semiconductor integrated circuit as a design rule.

As a result of the verification of electro-migration, the designer judges whether there are places of error in the layout data in the case where the line width value does not fulfill the design rule in the layout data. The designer also judges whether there are no places of error in the layout data in the case where the line width value fulfilled the design rule in the layout data.

In this way, the designer selects a wire which has a line width value more than a predetermined width and which has a length more than a predetermined length and executes a verification of electro-migration according to the following reasons. That is, in the electro-migration verification in step S1006, the designer manually calculates the device spec value. Therefore, because the semiconductor integrated device has a considerable number of wires, the human burden of executing a verification of electro-migration of the layout data of all the wires is great and requires a considerable amount of time. Consequently, the verification is restricted to those wires in which electro-migration is likely to occur.

As stated above, there is a high possibility that electro-migration may occur in a wire where the current which flows is large. It is usual to write a wide line width in the layout data of a wire in which the current which flows is large. However, in a wire whose length is short and the line width is wide, since the burden is small even when the current which flows in large, the possibility that electro-migration will occur is low. Consequently, the designer selects the layout data of a wire based on a standard where the wire has a line width more than a predetermined width and a length more than a predetermined length and executes a verification of electro-migration.

Next, in step S1007, in the case where the designer judges that there are places of error in the layout data, the designer corrects the layout data in these places (step S1008). Then, the designer again executes the steps S1005 to S1007 on the layout data after correction. Then, the designer repeats the steps S1005 to S1008 until the places of error detected in step S1007 are no longer detected.

In the case where the designer judges that there are no places of error in the layout data in step S1007, the designer judges that the layout data is complete (step S1009) and the generation of the layout data is finished (step 1010).

The above is a general operation of the layout data generation method where a verification of electro-migration is executed in the process which creates layout data of a semiconductor integrated circuit. However, in the flowchart stated above, because the designer visually checks the layout data, selects the wire which should be verified and manually calculates the device spec value, the human burden is great. Also, there is also a possibility that an omission in verification may occur in the places of error by human error. Consequently, as one means of improving the verification accuracy of electro-migration verification, it is possible to consider a layout data generation flow which is simplified and where the selection operation of a wire is assured, as explained below.

Figure 9:
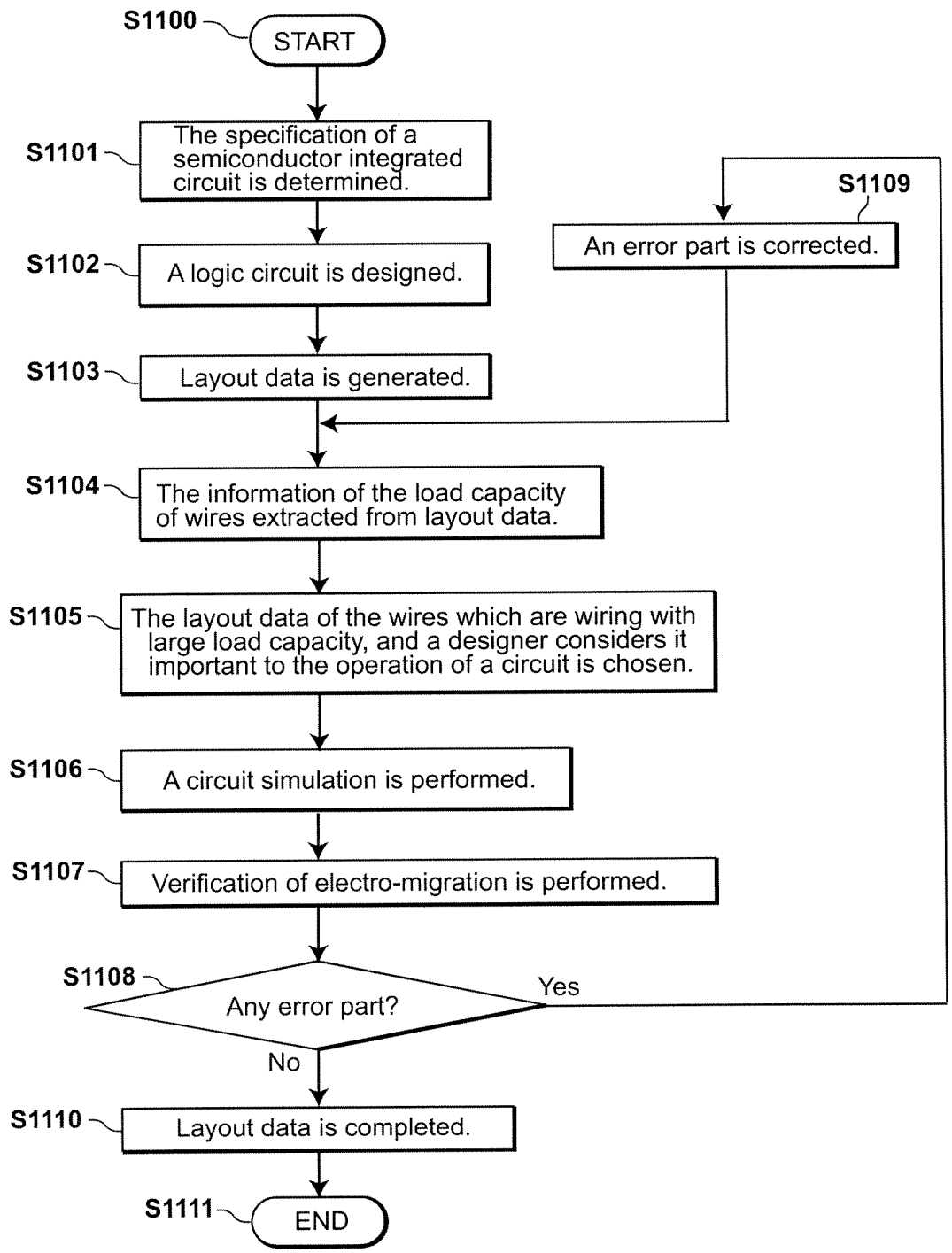
FIG. 9 is an example of an improvement of a flowchart of the layout data generation method shown in FIG. 8.

FIG. 9 is an example of an improvement of a flowchart of the layout data generation method shown in FIG. 8. FIG. 9 has been added with the steps S1104 and S1105 instead of steps S1004 between steps S1003 and S1005 in FIG. 8. Therefore, the operation of other steps of the layout generation method shown in FIG. 9 except for the operation of steps S1104 to S1105 and return after correcting an error part coming among steps S1103 and S1104 are the same as that of the layout data generation method shown in FIG. 8. Consequently, only the operations between steps S1104 and S1105 will be explained below.

As is shown in FIG. 9, in step S1104, the designer extracts load capacity information of a wire from layout data which has been generated in step S1103.

Next, the designer selects a wire which they consider to have a large load capacity and which has an important circuit operation from the extracted load capacity information of the wire (step S1105). This is because a large current flows in the wire which has a large load capacity and the possibility of electro-migration occurring is high. In addition, this is also because in order to ensure the reliability of a semiconductor integrated circuit, there are significant demands to prevent failures occurring in the wire whose circuit operation is considered important. Consequently, in the layout data generation flow shown in FIG. 9, a wire is selected based on this standard and a verification is executed.

According to the layout data generation flow stated above, the simplification and assurance of the selection operation of a wire which should be verified is improved and, it is possible to improve verification accuracy rather than the layout data generation flow shown in FIG. 8. However, in the layout data generation flow of FIG. 8 and FIG. 9, the amount lost through human work is large and it is impossible to avoid an omission in verification of the places of error cause by human error. As a result, the layout data is generated with places of error being missed and the reliability and yield of the semiconductor integrated circuit may drop despite a large amount of time and effort being used up in such operations.

Under these circumstances, the inventors of the present invention have focused on the direction of the current in a wire and found that there is a difference in the possibility of electro-migration occurring between a wire in which current flows in a single direction (herein called "a single direction current wire") and a wire in which current flows in both directions (herein called "a two-direction current wire").

That is, because electro-migration is caused by a shift in metal atoms as stated above, a shift in metal atoms occurs more easily in a single direction current wire than a two-direction current wire. In other words, the possibility of electro-migration occurring is higher in a single direction current wire than a two-direction current wire. As a result, in order to prevent electro-migration and in order to realize a semiconductor integrated circuit with high reliability and high yield, the design rule of the layout data set so that the line width value of a single direction current wire is taken wider than a two-direction current wire, consideration is given to the direction of each wire in the verification of electro-migration and it is preferred that the fulfillment of the design rule be verified.

Furthermore, the generation of layout data with a reduction in wires with an excessive line width value (herein called "over spec") by high integration of a semiconductor integrated circuit, is being demanded. In this light, the inventors of the present invention have been able to realize a semiconductor integrated circuit with high integration by performing a verification of electro-migration while considering the current direction of each wire.

That is, in the case where layout data of a wire is verified by the same verification rules without querying whether the wire is a single direction current wire or a two-direction current wire, particularly with a two-direction current wire, the designer judges that the wire has an insufficient line width value even though this wire has a line width value sufficient to prevent an occurrence of electro-migration and as a result, the layout data is sometimes programmed with a wire with over spec. Therefore, if a verification of electro-migration is executed with consideration for the current direction of each wire, it is possible to verify layout data of a wire by an allowable minimum line width value of the design rule set for each wire which has a different current direction. As a result, a wire with over spec is reduced from the layout data and it is possible to realize a semiconductor integrated circuit with high integration.

In this way, the inventors of the present invention have found that it is possible to improve the verification accuracy by automatically executing a verification of electro-migration while considering the current direction of a wire in the generation process of layout data and realize a semiconductor integrated circuit with high reliability, high yield and high integration.

A layout data generation equipment and a layout data generation method of a semiconductor integrated circuit of embodiment one of the present invention and a manufacturing method of a semiconductor device by this layout data generation equipment and layout data generation method will be explained below while referring to the drawings. Further, the following embodiments show one example of the present invention and the present invention is not limited to these embodiments.

[Construction of a Layout Data Generation Equipment]

FIG. 1 is a block diagram which shows an example construction of a layout data generation equipment 100 of a semiconductor integrated circuit related to embodiment one of the present invention. The layout data generation equipment 100 of embodiment one includes a logic circuit designing section 20 which designs a logic circuit based on the information of the specification of a semiconductor integrated circuit 10, a layout data generation section 30 which creates layout data based on the designed schematic of the logic circuit 20, a resistance information extraction section 40 which extracts information about the resistance of a wire from the generated layout data, a circuit simulation execution section 50 which executes a circuit simulation, an identification section of current direction 60 which identifies the direction of a current in this wire based on the extracted resistance information of the wire and an execution result of the circuit simulation, a verification section 70 which executes a verification of electro-migration and verifies whether there are any places of error which break a design rule in the generated layout data and generates that verification result, and a data output section 80 which outputs the layout data verified that there are no places of error by a verification stated above.

In addition, the flow of data in the logic circuit designing section 20, the layout data generation section 30, a resistance information extraction section 40, the circuit simulation execution section 50, the identification section of current direction 60, the verification section 70, the data output section 80 of the layout data generation equipment 100 of the semiconductor integrated circuit related to embodiment one, is shown in FIG. 1. Further, the construction of a layout data generation equipment 100 and flow of data in the layout data generation equipment 100 in embodiment one is not limited to that shown in FIG. 1. For example, it is possible to have a construction where the data output section 80 outputs data of a verification result by the verification section 70 in addition to the layout data generated by the layout data generation section 30.

[Layout Data Generation Method]

Figure 2:
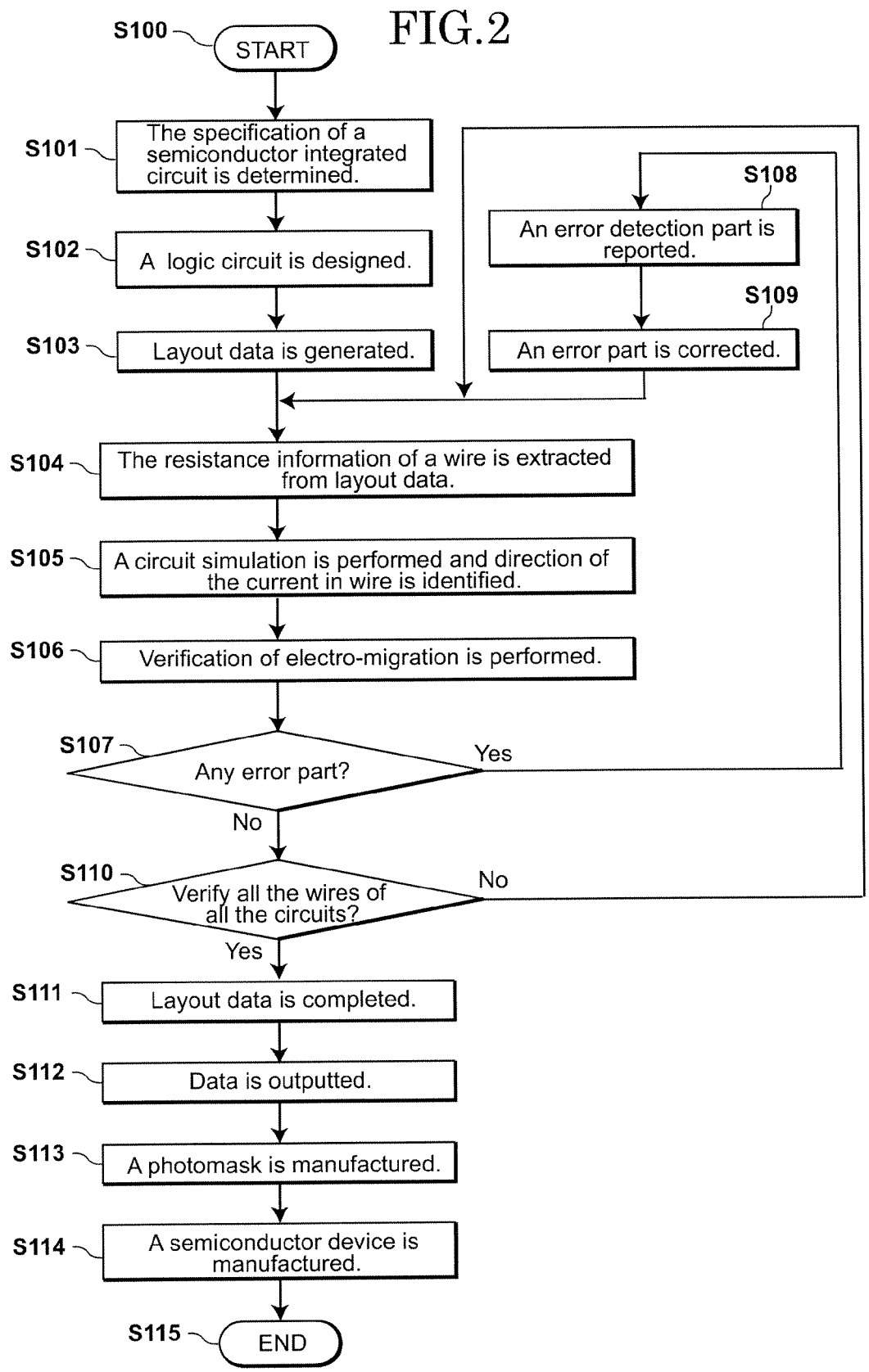
FIG. 2 is a flowchart which shows one example of the flow of operations in a layout data generation equipment related to embodiment one of the present invention.

Next, the layout data generation method of the semiconductor integrated circuit related to embodiment one will be explained in detail based on a flow of operations of the layout data generation equipment 100 while referring to the drawings. FIG. 2 is a flowchart which shows one example of a flow of operations of the layout data generation equipment 100 of embodiment one.

As is shown in FIG. 2, first the designer decides the specifications of the semiconductor integrated circuit (the information of the specification of the semiconductor integrated circuit 10, step S101). The line width value and design rule of the layout data are included in this information of the specification of the semiconductor integrated circuit 10.

Next, the designer designs a logic circuit based on the information of the specifications of the semiconductor integrated circuit 10 using the logic circuit designing section 20 (step S102).

Figure 3:
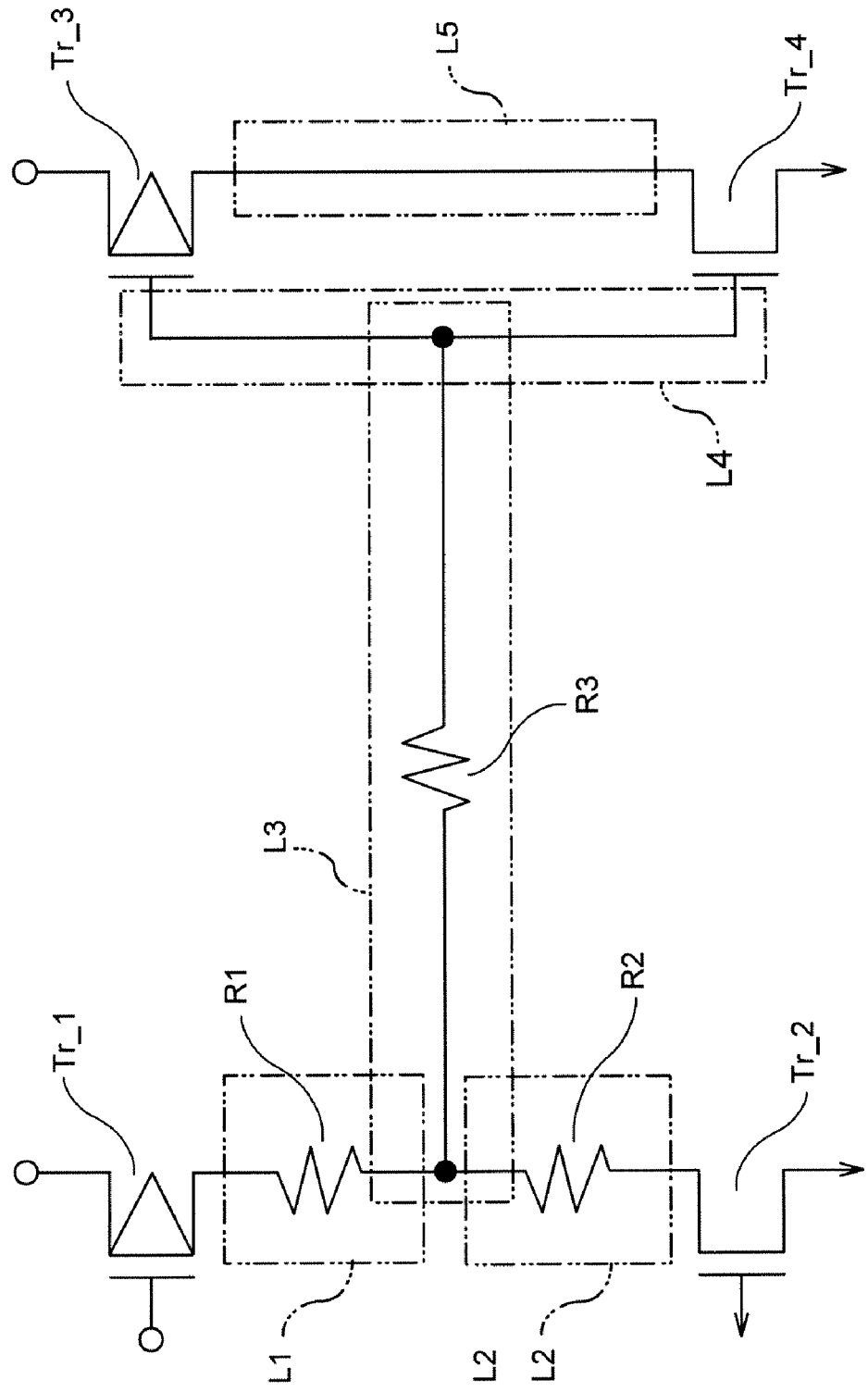
FIG. 3 is a drawing which shows one example of a logic circuit which is designed by a layout data generation equipment related to embodiment one of the present invention.

FIG. 3 is one example of the logic circuit designed by the logic circuit designing section 20 of the layout data generation equipment 100 related to embodiment one. As is shown in FIG. 3, the logic circuit designed by the logic circuit designing section 20 includes transistors Tr_1 to Tr_4, a wire L1 which has a resistor R1, a wire L2 which has a resistor R2, a wire L3 which has a resistor R3 and wires L4 and L5. The transistor Tr_1 and the wire L3 are connected using a contact C1 and a via V1 (not shown) by the wire L1, and the transistor Tr_2 and the line L3 are connected using a contact C2 and the via V1 (not shown) by the wire L2. In addition, a gate line GC3 (not shown) of the transistor Tr_3 is connected to the wire L4 using a via V2 (not shown) and a gate line GC4 (not shown) of the transistor Tr_4 is also connected to the wire L4 using a via V3 (not shown). The wires L3 and L4 are connected using a via V4 (not shown). In addition, the transistors Tr_3 and Tr_4 are each connected to the wire L5 using a contact C3 and a contact C4 (not shown) respectively. The schematic of the logic circuit explained above is generated in step S102.

Next, the layout data generation section 30 creates layout data (step S103) based on the schematic of the logic circuit designed in step S102.

Figure 4:
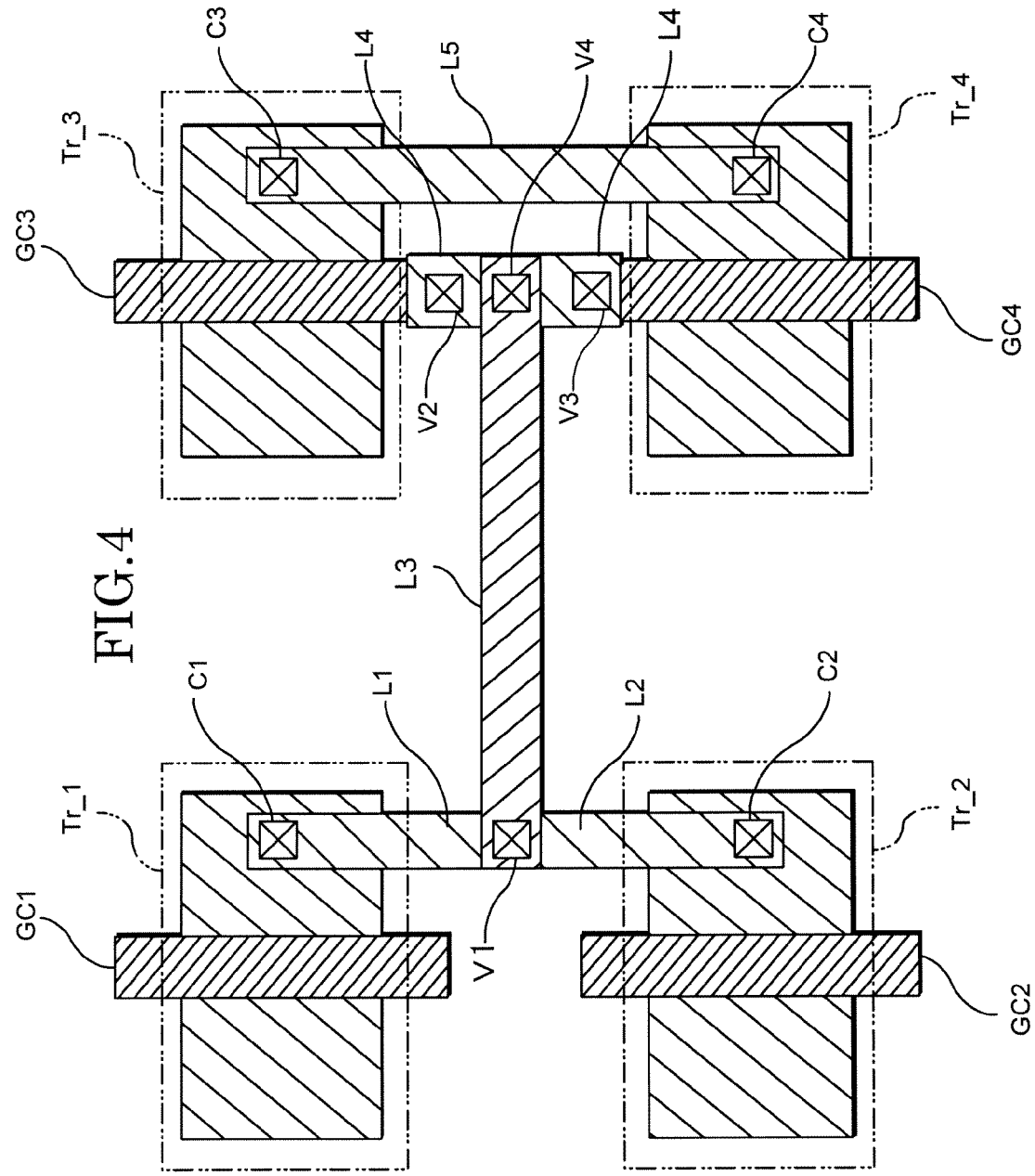
FIG. 4 is a drawing which shows one example of layout data generated by a layout data generation equipment related to embodiment one of the present invention.
Figure 5:
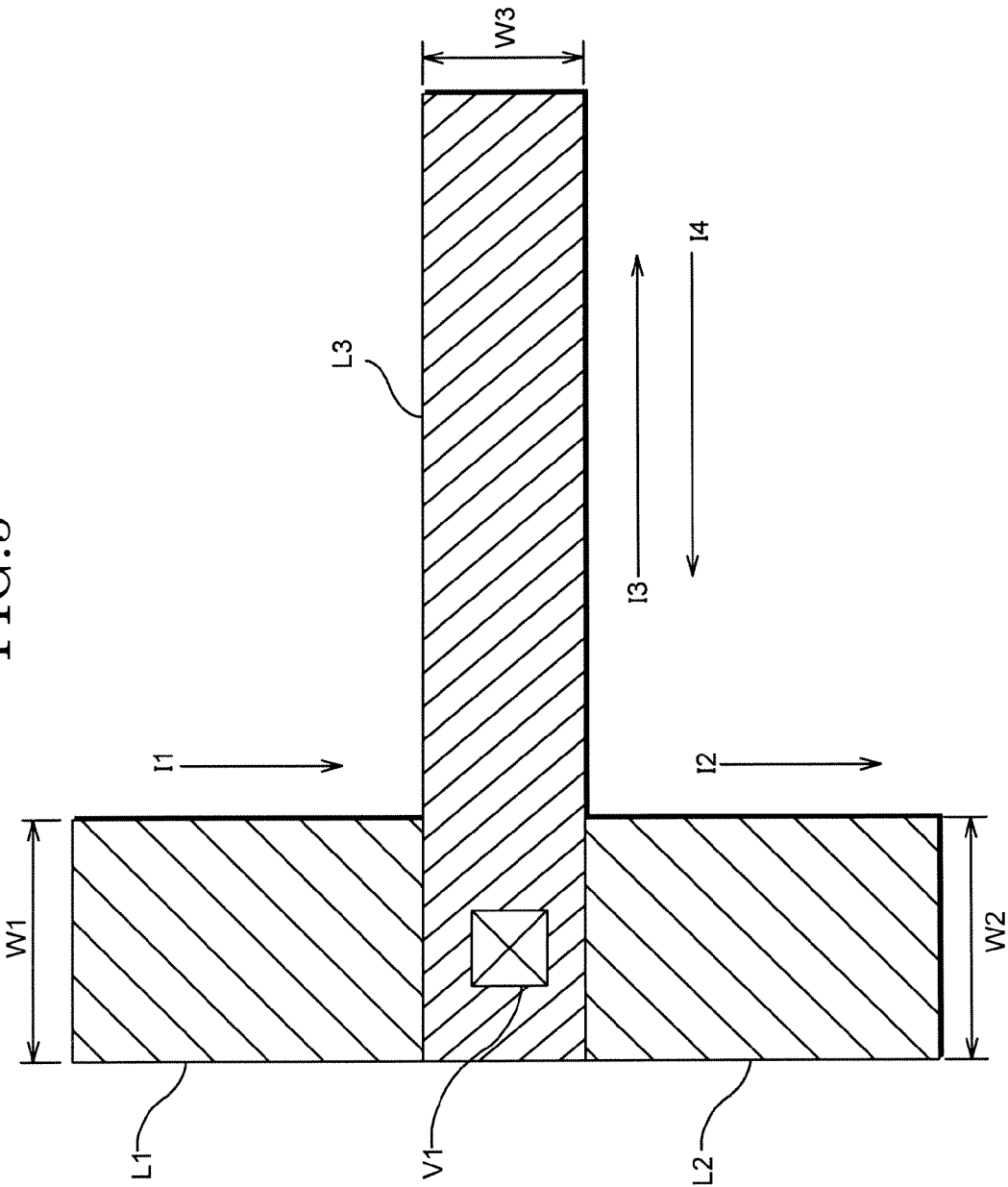
FIG. 5 is a drawing which shows one part of the layout data in FIG. 4.

FIG. 4 is one example of layout data generated by the layout data generation section 30 in embodiment one. FIG. 5 is an enlarged view of one part of the layout data shown in FIG. 4. As is shown in FIG. 4 and FIG. 5, the layout data generation section 30 creates layout data including the transistors Tr_1 to Tr_4, the gate lines GC1 to GC4, the wires L1 to L5, the contacts C1 to C4 and the via's V1 to V4 designed in step S102 based on the information of the schematic of the logic circuit. In addition, in the layout data in FIG. 4 and FIG. 5, the line width value of the wire L1 is set at W1, the line width value of the wire L2 is set at W2 and the line width value of the line L3 is set at W3.

Next, the resistance information extraction section 40 extracts the resistance information of a wire from the layout data which is generated in step S103 (step S104).

For example, the resistance information extraction section 40 extracts the information of the resistors R1, R2 and R3 of a wire from the layout data shown in FIG. 4 generated in step S103.

Next, the circuit simulation execution section 50 executes a circuit simulation and simulates a circuit operation. The identification section of current direction 60 monitors the current amplitude flowing in the resistance of each wire within a fixed period of time based on the extracted resistance information of the wire and the simulation result and the identification section of current direction 60 identifies whether this wire is a single direction current wire or a two-direction current wire based on the monitored current amplitude (step S105).

Specifically, for example, in embodiment one, the identification section of current direction 60 compares an integral value S of the current I and an absolute value A (an integral value of the absolute value) of the current I which flows in the resistors within a fixed period of time in the circuit simulation process and verifies whether a difference has occurred between these two values. That is, the identification section of current direction 60 verifies whether these two value's relationship is S≈A or S<A and identifies whether this wire is a single direction current wire or a two-direction current wire based on this verification result.

More specifically, in the case when the wire is a single direction current wire, the current which flows in a resistor R of the single direction current wire is given as Ia and when the current Ia is in a plus direction, the integral value S1 of the current Ia which flows in this resistor R within a fixed period of time t1 to t2 in the circuit simulation process is as shown in formula one below.

$$S1 = \int_{t1}^{t2} Ia \, dt > 0 \qquad \text{(Formula 1)}$$

In addition, the absolute value |A1| (integral value of the absolute value) of the current Ia which flows in the resistor R within the fixed period of time t1 to t2 in the circuit simulation process is as shown in formula two below.

$$|A1| = \int_{t1}^{t2} |Ia| \, dt > 0 \qquad \text{(Formula 2)}$$

Therefore, in the case where this wire is a single direction current wire, the relationship between the integral value S1 and the absolute value |A1| (integral value of the absolute value) is S≈|A1| and a large difference does not occur between the two values.

In the case where this wire is a two-direction current wire, the current which flows in the resistor R of the two-direction current wire is given as Ib and Ic and the current Ib is given as a plus direction current and when the current Ic is given as a minus direction current, the integral value S2 which is the sum of the integral value of the current Ib and the integral value of the current Ic which flows in the resistor R within the fixed period of time t1 to t2 in the circuit simulation process, is as shown in formula three below. That is, while the integral value of the current Ib becomes a positive value, the integral value of the current Ic becomes a negative value. As a result, the integral value S2 becomes a value which is lower than the absolute value |A2| (integral value of the absolute value) explained below.

$$S2 = \int_{t1}^{t2} Ib \, dt + \int_{t1}^{t2} Ic \, dt \qquad \text{(formula three)}$$

In addition, the sum |A2| of the absolute value (integral value of the absolute value) of the current Ib and the absolute value (integral value of the absolute value) of the current Ic which flow in the resistor R within a fixed period of time in the circuit simulation process is as shown in formula four below. That is, with regard to the absolute value |A2| (integral value of the absolute value), the direction of the current is not considered as unlike the integral value S2 and the absolute value |A2| is calculated by the total of the absolute value of the integral value computed about each direction of the currents.

$$|A2| = \int_{t1}^{t2} |Ib| \, dt + \int_{t1}^{t2} |Ic| \, dt > 0 \qquad \text{(formula 4)}$$

Therefore, in the case were this wire is a wire in which a current flows in both directions (two-direction current wire) the relationship between the integral value S2 and the absolute value |A2| (integral value of the absolute value) becomes S2<|A2| and a difference occurs between two values. Also, when current Ia stated above is the current of the minus direction it becomes S1<0, but on the other hand, |A1| certainly becomes |A1|>0. Since the relationship of S<|A1| is materialized and a difference occurs between two values, it can be identified that this wire is a single direction current wire.

In this way, the integral value and the absolute value (integral value of the absolute value) are compared and by verifying whether a difference more than a specific value occurs between these two values, it becomes possible to identify the direction of a current I which flows in the wire. Below, for the purposes of explanation, for example, in embodiment one, the wires L1 and L2 shown in FIG. 4 and FIG. 5 are judged to be single direction current wires and the wire L3 is judged to be a two-direction current wire by the kind of verification outlined above. The direction of the current in each wire 11 to 14 is shown by an arrow in FIG. 5.

Next, the verification section 70 executes a verification of electro-migration (step S106) and verifies whether there are any places of error which do not fulfill the design rule in the layout data of a wire of the semiconductor integrated circuit (step S107).

Specifically, first the verification section 70 calculates a device spec value of the wire. Next, the verification section 70 contrasts and compares the calculated device spec value with the line width value of the wire and verifies whether the line width value of this wire fulfills the design rule. In the design rule of embodiment one, the line width of a wire is widely set in a wire with a high device spec value than a wire with a low device spec value and by setting a wider line width in a single direction current wire than a two-direction current wire, electro-migration is prevented. Furthermore, in the design rule of the layout data generation method of the semiconductor integrated device related to embodiment one, the allowable minimum line width value of a wire is set and over spec of the wire is prevented. In embodiment one, by executing a verification in steps S106 and S107 by the verification section 70 based on these set design rule in the information of the specification of the semiconductor integrated circuit 10, it is possible to realize a semiconductor integrated circuit with high reliability, high yield and high integration.

For example, the verification section 70 verifies whether the line width value W1 of the wire L1, the line width value W2 of the wire L2 and the line width value W3 of the wire L3, breaks the design rule. Specifically, the verification section 70 verifies whether each wire meets the line width value of a wire which corresponds to the device spec value and also verifies whether the line width values of the line width values W1 and W2 of the single direction current wires L1 and L2 are set wider than the line width value W3 of the two-direction current wire L3 and further verifies whether the line width values W1, W2 and W3 meet the allowable minimum width value.

As a result of the above stated verification, in the case where the line width value of this wire does not fulfill the design rule, the verification section 70 judges that there are places of error in the layout data. In the case where the line width of this wire does fulfill the design rule, the verification section 70 judges that there are no places of error in the layout data and the verification section 70 transmits these judgment results to the layout data generation section 30.

In step S107, in the case where the verification section 70 has detected places of error, the layout data generation section 30 corrects the detected places of error in the layout data based on an electro-migration verification report from the verification section 70 (step S109). Next, the layout data generation equipment 100 again executes the verification in steps S104 to S107 of the corrected layout data. The layout data generation equipment 100 repeats the operation of correcting the layout data in steps S104 to S107 and in steps S108 to S109 until no more places of error are detected in step S107.

In this case where the verification section 70 does not detect any places of error in step S107, the verification section 70 verifies whether a verification of all the wires of the circuit in steps S104 to S109 has taken place (step S110). Then, in the case where the verification section 70 judges that a verification of all the wires has not been executed, the layout data generation equipment 100, executes the verification in steps S104 to S109 of the wires which have not been verified. In the case where the verification section 70 judges that a verification has been executed of all the wires, the verification section 70 transmits this judgment result to the layout data generation section 30. The layout data generation section 30 receives this judgment result and judges that the layout data is complete (step S111), and transmits the completed layout data to the data output section 80. The data output section 80 outputs the completed layout data which is transmitted from the layout data generation section 30 as data (step S112). This account above is the layout data generation method of the semiconductor integrated circuit related to embodiment one of the present invention.

As is explained above, because it is possible to automatically execute a verification of electro-migration which has considered the information regarding the direction of the current in a wire, according to the layout data generation equipment 100 related to embodiment one verification accuracy can be improved and human burden can be reduced. It is also possible to prevent the occurrence of electro-migration in a semiconductor integrated circuit and obtain the effect whereby a semiconductor integrated circuit with high reliability and high yield is realized. In addition, according to the layout data generation equipment 100 of embodiment one, it is possible to check the layout data of a wire with an allowable minimum line width value by executing a verification of electro-migration which has considered the direction of a current in a wire. Thereby, the over spec of the wire is prevented and the effect where it is possible to realize a semiconductor integrated circuit with high integration is acquired.

[Manufacturing Method of a Semiconductor Device]

Next, a manufacturing method of a semiconductor device related to embodiment one of the present invention will be explained. The manufacturing method of a semiconductor device related to embodiment one of the present invention includes a lithography process whereby a pattern transfer on a substrate using a pattern which is formed by a mask based on layout data formed in embodiment one or a lithography process which draws a pattern of layout data directly on a substrate by a processing device which uses an electron beam for example. A photo mask is manufactured by a mask manufacturing equipment 200 shown in FIG. 1 based on layout data generated by executing the layout data generation method stated above (step S100 to step S112) by the layout data generation equipment 100 stated above (step S113). Next, a pattern is formed on a substrate by exposure using the above photo mask by the semiconductor device manufacturing equipment 300, a semiconductor device is manufactured (step S114) and the completed (step S115). By this process, it is possible to manufacture a semiconductor device by the layout data generation method of a semiconductor integrated circuit related to embodiment one of the present invention. Further, in the manufacturing method of the semiconductor device related to embodiment one of the present invention, a pattern may be formed by drawing the layout data directly to the substrate by a processing device such as an electron beam.

In this case, the composition of a mask production equipment 200 etc is changed suitably and manages it.

Usually functional elements such as a transistor or diode are formed in advance on a substrate which is used in a process related to this embodiment (a semiconductor substrate or SOI (Silicon on Insulator) substrate). In addition, in the present embodiment, metal wire layers of polysilicon and tungsten may be formed before or after the processing process which uses the above stated pattern transfer process or electron beam. It is possible to obtain desired metal wire layers by processing these wire layers using the above stated pattern transfer process or electron beam. Usually, while repeating the above stated process a plurality of these metal wire layers is formed. Usually, an insulator is formed between each of these metal wire layers. In addition, by forming a connective conductor in a desired place of the insulator, the wire layers either side of this insulator can be electrically connected.

By this process, it is possible to form a pattern on a substrate based on layout data with improved reliability. Also, as a result, it is also possible to form various miniature semiconductor elements which are included inside a semiconductor device with a degree of accuracy. Therefore, according to the manufacturing method of the semiconductor device related to embodiment one of the present invention, it is possible to improve reliability and yield of a semiconductor device.

Embodiment Two

The layout data generation device, layout data generation method and the manufacturing method of a semiconductor device by this layout data generation equipment and layout data generation method of a semiconductor integrated circuit related to embodiment two of the present invention will be explained. In the layout data generation equipment 100 and the layout data generation method related to embodiment one stated above, a verification of electro-migration is conducted in all the wires of the semiconductor integrated circuit. In the layout data generation equipment 100 in embodiment two however, by the conditions which are given to the layout data generation equipment 100 by the designer in advance, a specific wire of the semiconductor integrated circuit is selected and a verification of electro-migration is executed.

The layout data generation equipment 100 related to embodiment two is the same as the layout data generation equipment 100 shown in FIG. 1 in embodiment one. Therefore, in embodiment two an explanation of the layout data generation equipment 100 will be omitted.

Figure 6:
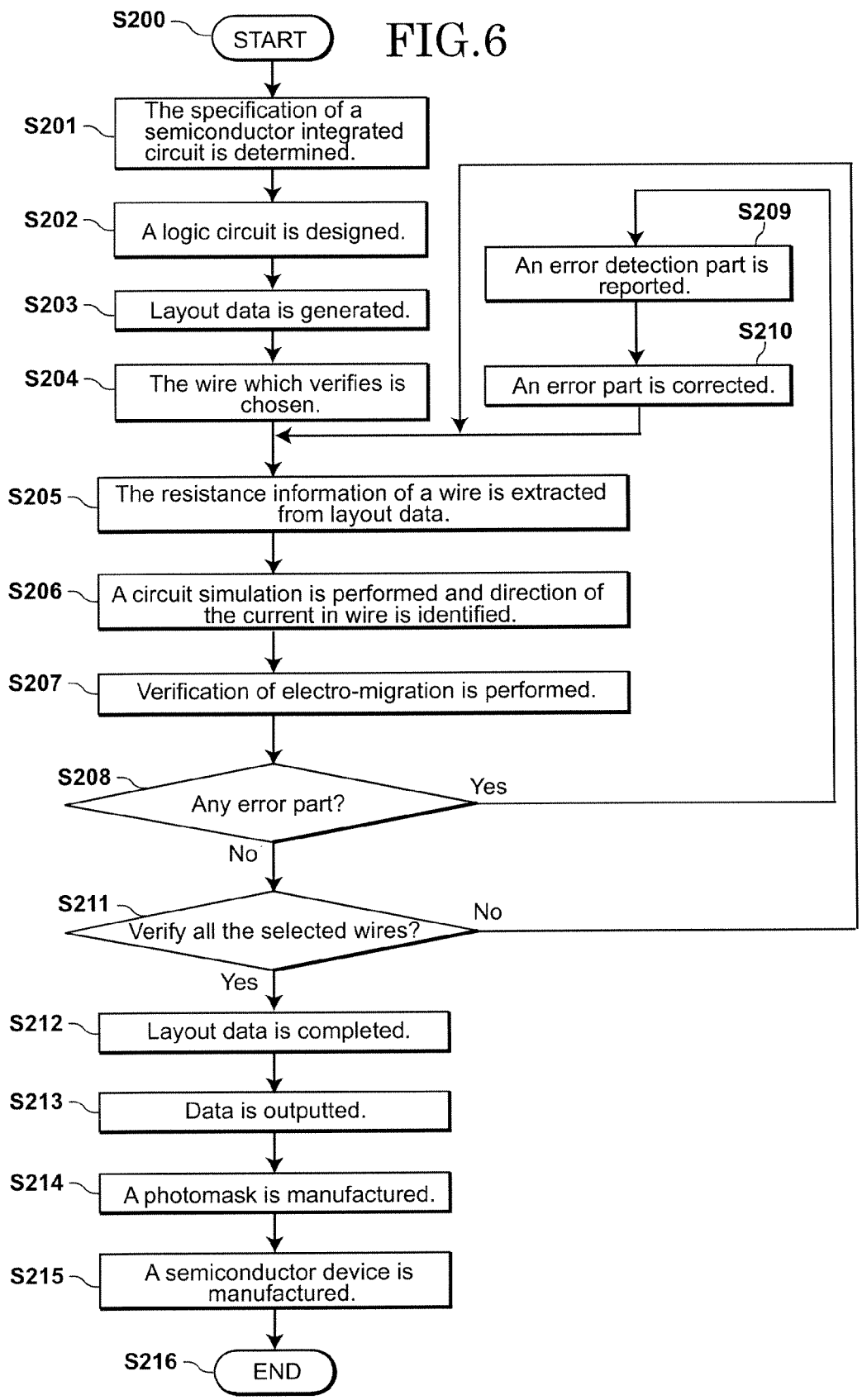
FIG. 6 is a flowchart which shows one example of the flow of operations in a layout data generation equipment related to embodiment one of the present invention.

FIG. 6 is a flowchart which shows one example of the flow of operations in the layout data generation equipment 100 related to embodiment two. The operations from step S200 up to step S203 in the flowchart of the operations of the layout data generation equipment 100 related to embodiment two shown in FIG. 6 and the operations from step S100 up to step S103 in the flowchart of the operations of the layout data generation equipment 100 related to embodiment one shown in FIG. 2 are the same. Therefore, in embodiment two an explanation of the operations from step S200 up to step S203 will be omitted.

In step S204 the layout data generation equipment 100 selects one or a plurality of wires from among the layout data generated in step S203 in accordance with the conditions given to the layout data generation equipment 100 in advance by the designer. These conditions are set in advance based on the size of load capacity or the importance of the circuits operations, for example. However, not limited to this, they can be optionally set. For example, in the layout data generation equipment 100 and the layout data generation method related to embodiment two it is possible to select a specific area of the layout data and execute a verification of the layout data limited to this area.

Because the operations after step S205 in embodiment two are the same as the operations after step S104 in the above stated embodiment one, their explanation is omitted in embodiment two. Further, in the case where a plurality of wires is selected and a verification is executed, it is possible to conduct a verification on each selected wire in turn or simultaneously in parallel.

As explained above, according to the layout data generation equipment 100 and the layout data generation method, it is possible to individually select a wire and execute a verification of electro-migration and thus it is also possible to reduce the time required for a verification of electro-migration. In addition, according the layout data generation equipment 100 and the layout data generation method related to embodiment two, by automatically executing a verification of electro-migration while giving consideration to the information regarding current direction in a wire, it is possible to improve verification accuracy and reduce human burden. By this it is also possible to prevent an occurrence of electro-migration and obtain the results whereby a semiconductor with high reliability and high yield is realized. Also, according to the layout data generation equipment 100 and the layout data generation method related to embodiment two, by executing a verification of electro-migration while giving consideration to the information regarding current direction in a wire it is possible to check the layout data of a wire by an allowable minimum line width value. By this it is possible to prevent over spec of a wire and obtain the effects whereby a semiconductor integrated circuit with high integration.

Then, by manufacturing a semiconductor device based on layout data with improved reliability and yield, it is possible to realize a semiconductor device with high reliability and high yield. Because the operations from step S213 up to step S216 shown in FIG. 6 which show the manufacture of the semiconductor device by the mask production equipment 200 and the semiconductor device production equipment 300 based on the layout data output from the data output section 80, are the same as the operations from step S112 up to step S115 of embodiment one shown in FIG. 2, their explanation is omitted.

Embodiment Three

As stated above, the possibility of electro-migration occurring in a single direction current wire is high. Consequently, in the layout data generation equipment, layout data generation method and the manufacturing method of a semiconductor device by this layout data generation equipment and layout data generation method of a semiconductor integrated circuit related to embodiment three of the present invention, a verification of electro-migration is executed only on single direction current wires among the wires which form a semiconductor integrated circuit.

The layout data generation equipment 100 related to embodiment three is the same as the layout data generation equipment 100 shown in FIG. 1 in embodiment one. Therefore, in embodiment three, an explanation of the layout data generation equipment 100 will be omitted.

Figure 7:
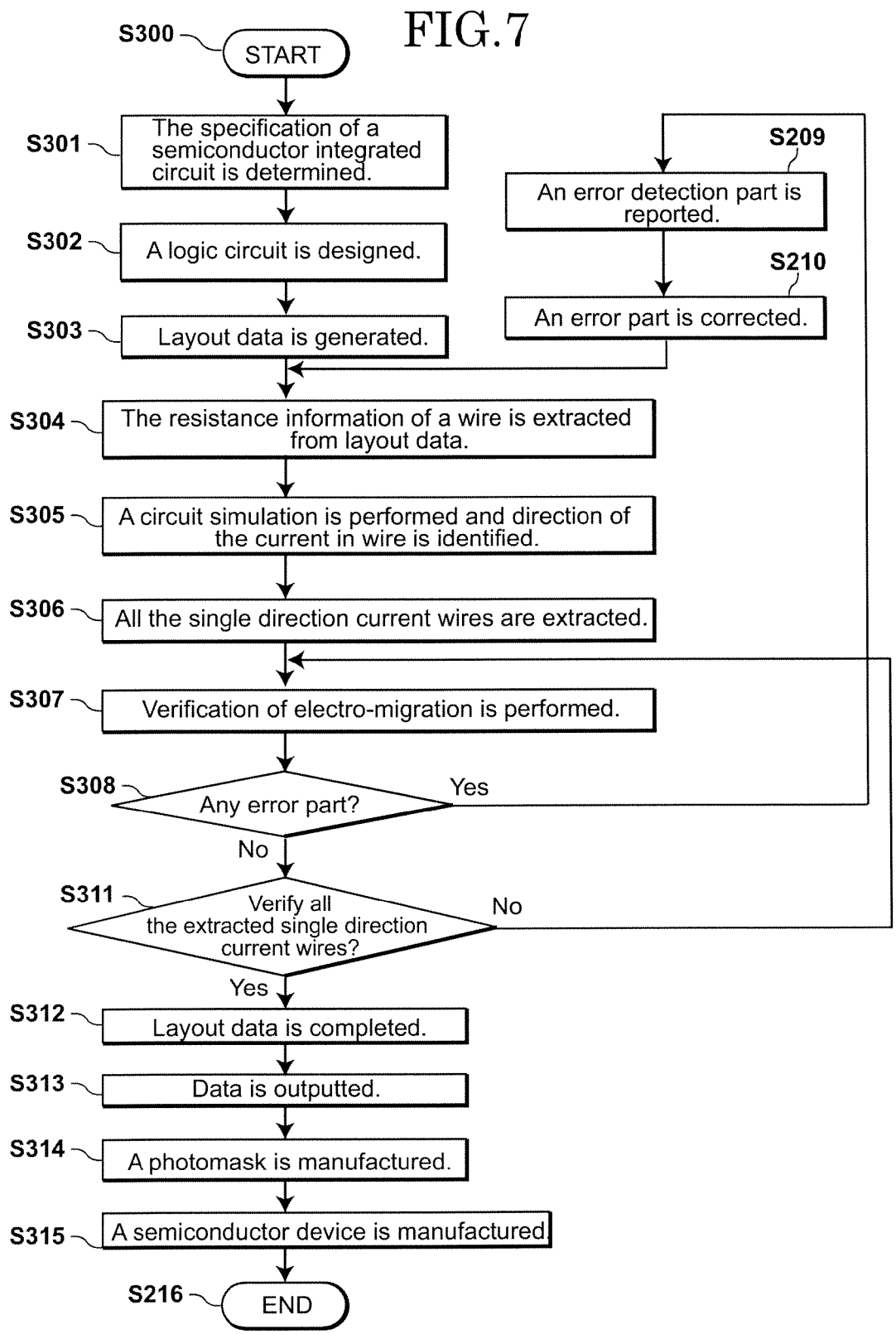
FIG. 7 is a flowchart which shows one example of the flow of operations in a layout data generation equipment related to embodiment one of the present invention.

FIG. 7 is a flowchart which shows the flow of operations of the layout data generation equipment 100 related to embodiment three. The operations from step S300 up to step S305 in the flowchart of the operations of the layout data generation equipment 100 related to embodiment three shown in FIG. 7 and the operations from step S100 up to step S105 in the flowchart of the operations of the layout data generation equipment 100 related to embodiment one shown in FIG. 2 are the same. Therefore, in embodiment three, an explanation of the operations from step S300 up to step S305 will be omitted.

In step S306, the verification section 70 extracts all the single direction current wires from among the wires of the semiconductor integrated circuit based on the information of current direction for each wire which is identified by the identification section of current direction 60 in step S305.

Next, the verification section 70 executes a verification of electro-migration on all these extracted single direction current wires (step S307).

Because the operations from step S307 up to step S310 are the same as the operations from step S106 up to step S109 in the flowchart of the operations of the layout data generation equipment 100 in embodiment one, their explanation is omitted in embodiment three.

Next, in step S308 in the case where the verification section 70 does not detect any places of error, the verification section 70 verifies whether the verifications from step S307 up to step S310 on all the extracted single direction current wires has been executed (step S311).

In step S311, in the case where the verification section 70 judges that the verifications have not been executed on all the single direction current wires, the layout data generation equipment 100 executes the verifications from step S307 up to step S308 on the wires which have not been verified and corrects the layout data in step S309 up to step S310.

However, in step S311 in the case where the verification section 70 judges that a verification has taken place on all the single direction current wires then the verification section 70 transmits this judgment result to the layout data generation section 30. The layout data generation section 30 receives this judgment result, judges that the layout data is complete (step S312) and transmits the completed layout data to the data output section 80. The data output section 80 outputs this judgment result as data by displaying the completed layout data on a display device or printing the layout data by a printer (step S313).

Further, the explanation of the layout data generation equipment 100 and layout data generation method of the semiconductor integrated circuit related to embodiment three stated above showed an example which executed a verification of electro-migration only on single direction current wires. However, according to the layout data generation equipment 100 and layout data generation method of the semiconductor integrated circuit related to embodiment three, it is also possible to extract two-direction current wires in step S306 and execute the verifications after step S307 only on these two-direction current wires.

As explained above, in the layout data generation equipment 100 and layout data generation method related to embodiment three, because it is possible to execute verification of electro-migration on a specific wire, it is possible to reduce the time required for verification of electro-migration. In addition, according to the layout data generation equipment 100 and layout data generation method related to embodiment three, by automatically executing a verification of electro-migration while giving consideration to the information regarding the current direction in wire, it is possible to improve verification accuracy and reduce human burden. By this it is also possible to prevent an occurrence of electro-migration of a semiconductor integrated circuit and obtain the results whereby a semiconductor integrated circuit with high reliability and high yield is realized. In addition, according to the layout data generation equipment 100 and layout data generation method related to embodiment three, by executing a verification of electro-migration while giving consideration to the information regarding the current direction in wire, it is possible to check whether the layout data of a wire has the correct width. By this, it is also possible to prevent an occurrence of electro-migration and obtain the results whereby a semiconductor integrated circuit with high integration is realized.

Then, by manufacturing a semiconductor device based on layout data with improved reliability and yield, it is possible to realize a semiconductor device with high reliability and high yield. Because the operations from step S313 up to step S316 shown in FIG. 7 which show the manufacture of the semiconductor device by the mask production equipment 200 and the semiconductor device production equipment 300 based on the layout data output from the data output section 80, are the same as the operations from step S112 up to step S115 of embodiment one shown in FIG. 2, their explanation is omitted.

What is claimed is:

1. A layout data verification equipment for a semiconductor integrated circuit comprising:
   a circuit simulation execution section which executes a circuit simulation;
   an identification section of current direction which identifies a direction of a current in a wire based on resistance information of the wire included in a layout data of a semiconductor integrated circuit and an execution result of said circuit simulation;
   a verification section which verifies whether layout data of said wire breaks a design rule, said design rule being extracted from information of the specifications of the semiconductor integrated circuit, based on a current direction of said wire and said verification section generates this verification result; and
   a data output section which outputs said layout data which said verification section verifies that all wires of the semiconductor integrated circuit do not break said design rule.

2. The layout data verification equipment according to claim 1, wherein said identification section of current direction calculates an integral value and an integral value of an absolute value of said current which flows in said resistance in the execution process of said circuit simulation, said identification section of current direction compares said integral value with said integral value of said absolute value, and said identification section of current direction identifies a direction of said current in said wire.

3. The layout data verification equipment according to claim 2, wherein said identification section of current direction identifies said wire as a wire where said current flows in two directions in the case where a difference more than a fixed value occurs between said integral value and said integral value of said absolute value of said current which flows in said resistance of an optional said wire, and identifies said wire as a wire where said current flows in one direction in the case where a difference which more than a fixed value does not occur between said integral value and said integral value of said absolute value of said current which flows in said resistance of an optional said wire.

4. The layout data verification equipment according to claim 1, wherein said verification section selects layout data of one wire or layout data of a specific wire from among layout data of all the wires which form said semiconductor integrated circuit, said verification section calculates a current amplitude per unit cross-section area of said selected wire or said specific wire, said verification section compares said current amplitude per unit cross-section area of said wire with a line width value of said wire and verifies whether said line width value of said wire based on information of said identified direction of each current which flows in each of said wires and also based on the design rule included in said information of the specification of said semiconductor integrated circuit and verifies whether said line value width of said wire breaks said design rule.

5. The layout data verification equipment according to claim 4, wherein the layout data of said one wire or said specific wire is selected according to conditions given in advance by a designer.

6. The layout data verification equipment according to claim 4, wherein the layout data of said one wire or said specific wire is layout data of all the wires in a specific area within said layout data.

7. The layout data verification equipment according to claim 4, wherein the layout data of said one wire or said specific wire is layout data of a wire which has been judged by said identification section of current direction to be a wire where said current flows in a single direction.

8. The layout data verification equipment according to claim 4, wherein the layout data of said one wire or said specific wire is layout data of a wire which has been judged by said identification section of current direction to be a wire where said current flows in two directions.

9. A manufacturing method of a semiconductor device comprising:
designing a logic circuit based on information of the specifications of a semiconductor integrated circuit;
generating layout data based on said logic circuit;
extracting resistance information of each wire from said layout data;
executing a circuit simulation based on said layout data;
identifying a direction of each current which flows in each of said wires based on said resistance information of each of said wires and on an execution result of said circuit simulation;
verifying whether said layout data of each of said wires breaks a design rule included in said information of the specifications of said semiconductor integrated circuit based on information of said identified direction of each current which flows in each of said wires and generating a verification result; and
forming a pattern on a substrate based on said layout data where all of said wires are verified as not breaking said design rule.

10. The manufacturing method of a semiconductor device according to claim 9, wherein transferring a pattern to a substrate by lithography using a pattern formed by a mask based on said layout data when it is verified that all wires have met said design rule.

11. The manufacturing method of a semiconductor device according to claim 9, wherein said layout data is directly drawn to a substrate by a processing device using an electron beam when it is verified that all wires have met said design rule.

12. A layout data generation equipment for a semiconductor integrated circuit, comprising:
a logic circuit designing section which designs a logic circuit based on information of specifications of a semiconductor integrated circuit;
a layout data generation section which creates layout data based on said logic circuit;
a resistance information extraction section which extracts resistance information of a wire from said layout data;
a circuit simulation execution section which executes a circuit simulation;
an identification section of current direction which identifies a direction of a current in said wire based on said resistance information of the wire and an execution result of said circuit simulation;
a verification section which verifies whether layout data of said wire breaks a design rule, said design rule being extracted from said information of the specifications of the semiconductor integrated circuit, based on a current direction of said wire and said verification section generates this verification result; and
a data output section which outputs said layout data which is generated by said layout data generation section and said verification section verifies all wires do not break said design rule.

13. A verifying method of layout data of a semiconductor integrated circuit using a layout data verification equipment, comprising:
executing a circuit simulation based on layout data;
identifying a direction of each current which flows in each wire of a plurality of wires based on resistance information of each of said wires included in said layout data and on an execution result of said circuit simulation;
verifying whether said layout data of each of said wires breaks a design rule included in said information of the specifications of said semiconductor integrated circuit based on information of said identified direction of each current which flows in each of said wires and generating a verification result; and
outputting said layout data when all of said wires are verified as not breaking said design rule.

14. The verifying method of layout data of a semiconductor integrated circuit using a layout data verification equipment according to claim 13, wherein an integral value of each of said currents which flows in the resistance of each of said wires and an integral value of an absolute value of each of said currents are calculated, said integral value of each of said currents and said integral value of said absolute value of each of said currents is compared and the direction of each current which flows in each of said wires is identified.

15. The verifying method of layout data of a semiconductor integrated circuit using a layout data verification equipment according to claim 14, wherein each of said wires is identified as a wire where said current flows in two directions in the case where a difference more than a fixed value occurs between said integral value and said integral value of said absolute value of said current which flows in said resistance of an optional said wire, and identifies each of said wires as a wire where said current flows in one direction in the case where a difference which more than a fixed value does not occur between said integral value and said integral value of said absolute value of said current which flows in said resistance of an optional said wire.

16. The verifying method of layout data of a semiconductor integrated circuit using a layout data verification equipment according to claim 13, further comprising;
selecting layout data of one or a specific wire from among layout data of all of said wires which form said semiconductor integrated circuit;
calculating a current amplitude per unit cross-section area of said selected one or specific wire;
comparing said current amplitude per unit cross-section area of said selected one or specific wire with a line width value of said wire based on said design rule included in the information of said current direction and also included in the information of the specifications of said semiconductor integrated circuit, and verifying whether said line width value of said wire fulfills said design rule.

17. The verifying method of layout data of a semiconductor integrated circuit using a layout data verification equipment according to claim 16, wherein the layout data of said one wire or said specific wire is selected according to conditions given in advance by a designer.

18. The verifying method of layout data of a semiconductor integrated circuit using a layout data verification equipment according to claim 16, wherein the layout data of said one wire or said specific wire is layout data of all the wires in a specific area within said layout data.

19. The verifying method of layout data of a semiconductor integrated circuit using a layout data verification equipment according to claim 16, wherein the layout data of said one wire or said specific wire is layout data of a wire that has been judged by said identification section of current direction to be a wire where said current flows in a single direction.

20. The verifying method of layout data of a semiconductor integrated circuit using a layout data verification equipment according to claim 16, wherein the layout data of said one wire or said specific wire is layout data of a wire that has been judged by said identification section of current direction to be a wire where said current flows in two directions.

* * * * *